United States Patent [19]
Sanders

[11] 3,946,426
[45] Mar. 23, 1976

[54] INTERCONNECT SYSTEM FOR INTEGRATED CIRCUITS

[75] Inventor: Thomas J. Sanders, Indialantic, Fla.

[73] Assignee: Harris Corporation, Cleveland, Ohio

[22] Filed: Sept. 6, 1974

[21] Appl. No.: 503,980

Related U.S. Application Data

[63] Continuation of Ser. No. 341,049, March 14, 1973, abandoned.

[52] U.S. Cl. ............... 357/71; 357/68; 357/69
[51] Int. Cl.² ............... H01L 23/48; H01L 29/44; H01L 29/54
[58] Field of Search ............... 357/65, 68, 69, 71

[56] References Cited
UNITED STATES PATENTS

| | | | |
|---|---|---|---|
| 3,614,547 | 10/1971 | May | 357/65 |
| 3,649,945 | 3/1972 | Waits | 357/65 |
| 3,757,176 | 9/1973 | Kano et al. | 357/65 |

*Primary Examiner*—Stanley D. Miller, Jr.
*Assistant Examiner*—E. Wojciechowicz
*Attorney, Agent, or Firm*—Leitner, Palan & Martin

[57] ABSTRACT

An integrated circuit having a metal interconnect system formed with molybdenum engaging all contact areas of N conductivity type regions and aluminum engaging said molybdenum and engaging all contact areas of P conductivity type regions.

7 Claims, 3 Drawing Figures

INTERCONNECT SYSTEM FOR INTEGRATED CIRCUITS

BACKGROUND OF THE INVENTION

This is a continuation of application Ser. No. 341,049, filed Mar. 14, 1973, now abandoned.

1. Field of the Invention

The present invention relates generally to interconnects for integrated circuits and more particularly to the fabrication of a combination molybdenum and aluminum interconnect system.

2. Prior Art

A major product of the semi-conductor industry is integrated circuits formed of planar semiconductor devices in a substrate of silicon. Generally, a silicon oxide or glass coating overlies the silicon substrate, except in the actual contact areas. This coating functions to pacify the junctions and provide an insulation between the devices and the interconnects. Accordingly, the contact metal material must exhibit good adherence to the silicon and to the silicon oxide or glass, while not producing any undesirable reaction with — nor penetration of — the silicon or the oxide.

A metal interconnect system for integrated circuits must make a low resistance, non-rectifying contact to all types of silicon and must not react substantially with the silicon at moderate temperatures (500°C.). Aluminum has been found most suitable for use as interconnect with silicon planar devices in integrated circuits. Aluminum is an excellent conductor and adheres well to silicon and silicon oxide. It is also easily applied to semiconductor devices by evaporation and photoresist techniques and contacts made of aluminum are readily bondable with gold or aluminum wires.

Though aluminum has many excellent qualities and is widely used in the industry, it also has a variety of disadvantages. Specifically, aluminum and silicon greatly interfuse at 500°C. and since aluminum is a P type dopant, it can form a PN rectifying junction with the N type silicon. Thus, aluminum does not make a good ohmic contact with N type silicon.

In a high frequency double-diffused NPN transistor, the emitter region is typically diffused into the base region to a very shallow depth of only about 1,500 to 2,000 angstroms. Due to the small geometry of the shallow double-diffused transistor, the edge of the emitter diffusion opening in the oxide mask layer is so close to the emitter-base junction at the surface of the wafer that horizontal migration of the interaction between the aluminum and the silicon formed during the alloying process of the aluminum at approximately 500°C. often shorts out the base-emitter junction as well as vertical migration, which may also short out the emitter-base junction.

The prior art tries to avoid the above problems by using different contact metals wherein possibly one of the layers is aluminum because of its good contact with exterior metal wire. Some metal systems even use molybdenum in direct contact with P— silicon, but molybdenum does not form a low resistance contact with all types of silicon.

SUMMARY OF THE INVENTION

In order to retain the advantages of using aluminum while minimizing the disadvantages, this invention forms the metal interconnect system having molybdenum in contact with all N type contact areas and aluminum in contact with the molybdenum and with all P type contact areas. The combined molybdenum-aluminum interconnect system makes low resistance, non-rectifying contacts with the doped silicon while not reacting substantially with the silicon at moderate temperatures.

Accordingly, it is a principal object of the present invention to provide an improved metal interconnect system for planar doped silicon semiconductor devices in integrated circuits.

Another object of the present invention is to provide an interconnect system using aluminum having low resistance, non-rectifying contacts with the silicon.

A still further object of the present invention is to provide an aluminum interconnect system which will not substantially react with the silicon in shallow diffused N type emitter regions at moderate temperatures so as to prevent shorting of the emitter-base junction.

DETAILED DESCRIPTION OF THE INVENTION

Figure 1:
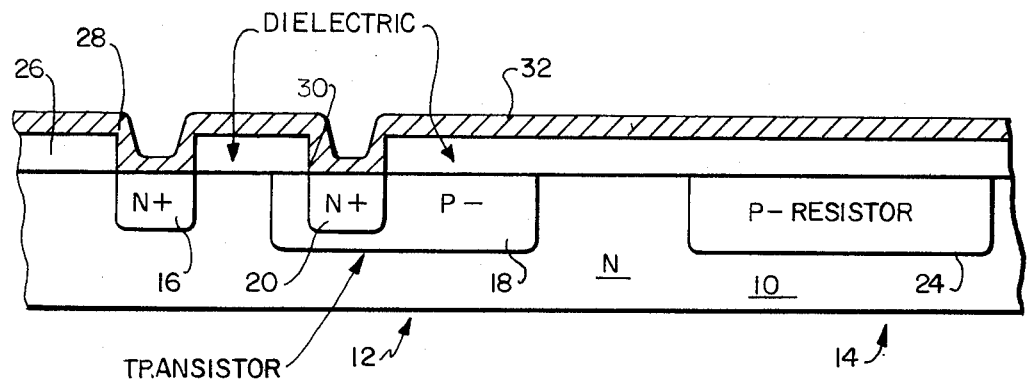
FIGS. 1–3 are cross-sectional views of an integrated circuit structure in successive stages of development in the fabrication of the molybdenum-aluminum interconnect system.

FIG. 1 depicts an integrated circuit fabricated within a body of semiconductor material 10, preferably N— silicon. The integrated circuit contains a shallow diffused NPN transistor 12 and a P— type resistor 14. The circuit may also include PNP type transistors, N type resistors and other semiconductor devices. The transistor 12 has an N+ type collector contact region 16 formed in the substrate 10, a P— type base region 18 formed in the substrate 10, and an N+ type emitter region 20 formed in the base region 18. The resistor 14 has a P— region 24 formed in the substrate 10. The total wafer is covered by a dielectric layer of isolating material 26, preferably silicon oxide. All of these regions are formed by conventional planar diffusion techniques.

Upon completion of the planar semiconductor devices, a conventional photoresist and oxide etch process is used to expose N+ type contact apertures in the silicon oxide layer 26, which for the devices shown in FIG. 1, are collector contact aperture 28 and emitter contact aperture 30. As is well known in this process, a photoresist layer is deposited on the oxide mask, the photoresist is exposed to light in accordance with a desired pattern, the pattern is developed through unexposed portions of the photoresist and the exposed portions of the oxide layer are removed with a suitable etchant. The remaining photoresist is then removed by stripping to leave an oxide mask with windows for the subsequent metal deposition.

The wafer is then cleaned and placed in a vacuum evaporation apparatus. In this apparatus, the molybdenum is first melted and then vaporized by a heated filament. A thin film of molybdenum metal of approximately 500–1000 angstroms is deposited on the wafer as shown in FIG. 1 as layer 32. Though using vacuum evaporation techniques, the molybdenum may be deposited by electronic beam vacuum evaporation or sputtering.

Figure 2:
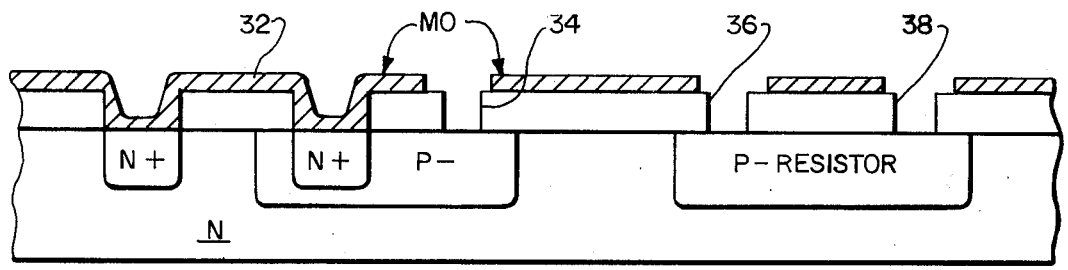

The metallized wafer is again coated with photoresist, exposed with a new mask to define the contact apertures for the P type regions, which for the devices shown in FIG. 2, are base contact aperture 34 and resistor contact apertures 36 and 38. The exposed photoresist is developed and a suitable etchant is used to remove the molybdenum above the P contact regions. Using the molybdenum as a mask, the dielectric 32 is removed by a suitable etchant to expose the planar surface of the P type contact regions. At this point, the molybdenum may be etched again to eliminate any molybdenum hangover of the P contact apertures 34, 36 and 38.

Figure 3:
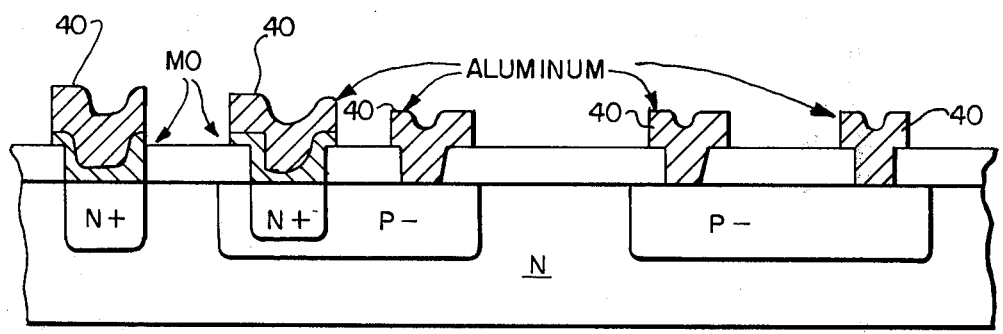

The remaining photoresist is then removed by stripping and the wafer is cleaned. A layer of aluminum of approximately 10,000 angstroms is deposited over the total wafer by vacuum evaporation, preferably, or any of the methods previously enumerated. A photoresist process is performed to define the interconnect patterns between the devices in the integrated circuit producing the structure as shown in FIG. 3. The N+ contact regions of collector 16 and emitter 20 have a combined molybdenum-aluminum metal contact formed of molybdenum layer 32 and aluminum layer 40. The base region 18 and the P− resistor have metal contacts formed from aluminum layer 40 only. The interconnect system of the present invention also provides a molybdenum layer between the aluminum layer and the dielectric insulator 32.

The final structure is primarily aluminum interconnect system wherein all emitter and other N+ contacts are made of molybdenum and aluminum and all P− base and resistor contacts are made of aluminum. This interconnect structure then satisfies both the requirements that the metal make a low resistive, non-rectifying contact with all types of silicon and that the metal must not react substantially with silicon at moderate temperatures.

The above processes may be modified so as to use only two photoresist processes instead of three to form the interconnect dual metal system of the present invention. To accomplish this, the emitter region and the collector contact region must be formed using a wash emitter process. This process involves the diffusion of the emitter and the collector contact region in an atmosphere such that only a small amount of oxide grows in these contact regions during diffusion. This small amount of oxide is removed by a non-selective oxide removal. Thus the additional photoresist and oxide etch to define the N+ contact regions and the eliminated andthe process of the present invention would include no extra steps over that used for conventional one-metal interconnect systems. The process then proceeds as previously described wherein the molybdenum is deposited, contact windows are etched through the molybdenum and the insulator to provide contact windows for the -contact areas, aluminum is deposited and the aluminum and molybdenum are delineated to define the interconnect pattern.

What is claimed is:
1. A semiconductor device comprising:
  a silicon wafer having P and N conductivity type regions therein and having one face coated with a silicon oxide;
  a first layer of molybdenum engaging a surface of selective N conductivity type regions in an opening in said oxide coating, thereby forming an ohmic contact;
  a first layer of aluminum engaging a surface of selective P conductivity type regions in an opening in said oxide, thereby forming an ohmic contact, the metal engaging said selected N regions being only molybdenum and the metal engaging said selected P regions being only aluminum; and
  a plurality of interconnections, each including a second layer of molybdenum engaging said silicon oxide layer and a second layer of aluminum superimposed on said second molybdenum layer, said second layer of aluminum engages a respective contact formed by said first molybdenum or aluminum layer.

2. A semiconductor device as in claim 1 wherein said second layer of molybdenum is a portion of said first layer of molybdenum simultaneously applied to said silicon wafer and patterned to form said interconnections.

3. A semiconductor device as in claim 1 wherein said second layer of aluminum is a portion of said first layer of aluminum simultaneously applied to said silicon wafer and patterned to form said interconnections.

4. A metal interconnect system for integrated circuits having a silicon wafer coated on one face with a silicon oxide comprising:
  a first layer of molybdenum engaging all contact areas of only N conductivity type regions through openings in said oxide coating to form ohmic contacts;
  a first layer of aluminum engaging all contact areas of only P conductivity type regions through openings in said oxide coating to form ohmic contacts; and
  interconnections between said first layers of metals engaging said contact areas including a second layer of molybdenum layer engaging said oxide coating and a second layer of aluminum superimposed on said second molybdenum layer, said second aluminum layer engages selected first layer metals that are to be interconnected.

5. A metal interconnect system as in claim 4 wherein said second layer of molybdenum is a portion of said first layer of molybdenum simultaneously applied to said silicon wafer and patterned to form said interconnections.

6. A metal interconnect system as in claim 4 wherein said second layer of aluminum is a portion of said first layer of aluminum simultaneously applied to said silicon wafer and patterned to form said interconnections.

7. A semiconductor device comprising:
  a silicon wafer having shallow P and N conductivity type diffused regions;
  a layer of aluminum located over said wafer and engaging all contact areas of regions of only said P conductivity type, thereby forming ohmic contacts with said P type regions;
  a layer of molybdenum between said layer of aluminum and contact areas of regions of only N conductivity type, thereby forming ohmic contacts with said N type regions and between said layer of aluminum and said silicon wafer, thereby forming interconnects; and
  a layer of insulation between said layer of molybdenum which forms said interconnects and said silicon wafer, said interconnects connect selected ohmic contacts by said layer of aluminum.

* * * * *